United States Patent
Yasuda et al.

(10) Patent No.: US 11,475,946 B2
(45) Date of Patent: Oct. 18, 2022

(54) SYNAPSE WEIGHT UPDATE COMPENSATION

(71) Applicant: INTERNATIONAL BUSINESS MACHINES CORPORATION, Armonk, NY (US)

(72) Inventors: Takeo Yasuda, Nara (JP); Atsuya Okazaki, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 16/744,762

(22) Filed: Jan. 16, 2020

(65) Prior Publication Data

US 2021/0225439 A1 Jul. 22, 2021

(51) Int. Cl.
| | |
|---|---|
| G06N 3/063 | (2006.01) |
| G11C 11/54 | (2006.01) |
| G11C 11/56 | (2006.01) |
| G11C 11/409 | (2006.01) |
| H03K 19/17728 | (2020.01) |

(52) U.S. Cl.
CPC .............. *G11C 11/54* (2013.01); *G06N 3/063* (2013.01); *G11C 11/409* (2013.01); *G11C 11/5628* (2013.01); *G11C 11/5642* (2013.01); *H03K 19/17728* (2013.01)

(58) Field of Classification Search
CPC ... G11C 11/54; G11C 11/409; G11C 11/5628; G11C 11/5642; G06N 3/063
See application file for complete search history.

(56) References Cited

U.S. PATENT DOCUMENTS

| | | |
|---|---|---|
| 2018/0322920 A1 | 11/2018 | Hosokawa et al. |
| 2019/0026629 A1 | 1/2019 | Busch et al. |
| 2019/0122105 A1 | 4/2019 | Boybat Kara et al. |
| 2019/0156194 A1 | 5/2019 | Burr |
| 2019/0228295 A1 | 7/2019 | Yasuda et al. |

(Continued)

FOREIGN PATENT DOCUMENTS

| | | |
|---|---|---|
| WO | 2018087617 A1 | 5/2018 |
| WO | 2019147522 A2 | 8/2019 |

OTHER PUBLICATIONS

International Search Report issued in PCT Application No. PCT/IB2020/062406, dated Apr. 9, 2021, pp. 1-9.

*Primary Examiner* — Seokjin Kim
(74) *Attorney, Agent, or Firm* — Tutunjian & Bitetto, P.C.; Randall Bluestone

(57) ABSTRACT

A synapse memory system includes synapse memory cells, each of which includes a non-volatile random access memory (NVRAM). Each synapse memory cell is configured to store a weight value according to an output level of a write signal. A write portion is configured to write the weight value to each synapse memory cell and includes a write driver and an output controller. The write driver is configured to output the write signal to each synapse memory cell. The output controller is configured to control the output level of the write signal of the write driver. Read drivers are configured to read the weight value stored in the synapse memory cells. The output controller is configured to control the output level of the write signal in updating the weight value in the synapse memory cell, to compensate for weight value variation according to a device characteristic of the NVRAM.

11 Claims, 13 Drawing Sheets

(56) References Cited

U.S. PATENT DOCUMENTS

| | | |
|---|---|---|
| 2019/0279079 A1 | 9/2019 | Sim et al. |
| 2020/0168271 A1* | 5/2020 | Vasyltsov ............ G11C 7/1006 |
| 2021/0142156 A1* | 5/2021 | Tran .................... G06N 3/0635 |
| 2021/0209457 A1* | 7/2021 | Tran ................... G11C 16/3463 |

* cited by examiner

| Compensation amount for unit weigt increment in each current weight region | | | | | | | | | | | | | | | |
|---|---|---|---|---|---|---|---|---|---|---|---|---|---|---|
| Weight region | R0 | R1 | R2 | R3 | R4 | R5 | R6 | R7 | R8 | R9 | R10 | R11 | R12 | R13 |
| Comp. amount | 0 | -5 | -6 | -5 | -3 | -1 | 2 | 4 | 3 | -6 | -6 | -5 | -3 | 0 |

110

| Compensation amount for unit weigt decrement in each current weight region | | | | | | | | | | | | | | |
|---|---|---|---|---|---|---|---|---|---|---|---|---|---|---|
| Weight region | R0 | R1 | R2 | R3 | R4 | R5 | R6 | R7 | R8 | R9 | R10 | R11 | R12 | R13 |
| Comp. amount | 0 | 3 | 5 | 6 | 7 | 6 | 5 | 0 | -3 | -4 | -4 | -3 | -2 | 0 |

| Weight (or conductance) step | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | ... |
|---|---|---|---|---|---|---|---|---|---|---|---|---|---|---|---|---|---|---|---|---|---|---|---|---|---|---|---|---|---|---|---|---|
| Weight (or conductance) region | R0 | | | | | | | | | | R1 | | | | | | | | | | R2 | | | | | | | | | | | ... |

Weight region assignment

| ... | 119 | 120 | 121 | 122 | 123 | 124 | 125 | 126 | 127 | 128 | 129 | 130 | 131 | 132 | 133 | 134 | 135 | 136 | 137 | 138 | 139 |
|---|---|---|---|---|---|---|---|---|---|---|---|---|---|---|---|---|---|---|---|---|---|
| ... | R12 | | | | | | | | | | | R13 | | | | | | | | | |

SYNAPSE WEIGHT UPDATE COMPENSATION

BACKGROUND

The present invention relates to synapse weight update compensation.

A non-volatile analog memory, which has characteristics such that resistance and capacitance can by controlled continuously, may be used to store a synapse weight value in a neuromorphic system, and the synapse weight value may be updated from time to time. The update amount from a given current synapse weight value is desired to be constant, or at least to be controllable, throughout all non-volatile analog memories included in the system.

SUMMARY

According to an aspect of the present invention, there is provided a synapse memory system. The synapse memory system includes plural synapse memory cells, a write portion, and plural read drivers. Each synapse memory cell includes a non-volatile random access memory (NVRAM). Each synapse memory cell is configured to store a weight value according to an output level of a write signal. The weight value to be stored in each synapse memory cell is one value of at least three different values. The write portion is configured to write the weight value to each synapse memory cell. The write portion includes a write driver and an output controller. The write driver is configured to output the write signal to a subject synapse memory cell. The subject synapse memory cell is one of the synapse memory cells. The subject synapse memory cell is selected to store the weight value. The output controller is configured to control the output level of the write signal of the write driver. The read drivers are configured to read the weight value stored in the synapse memory cells. The output controller is configured to compensate for the output level of the write signal in updating the weight value stored in the synapse memory cell, according to a device characteristic of the NVRAM in the synapse memory cell.

According to another embodiment of the present invention, there is provided a synapse memory system. The synapse memory system includes plural synapse memory cells, a write portion, and plural read drivers. The plural synapse memory cells are provided at cross points of plural axon lines and plural dendrite lines. Each synapse memory cell includes a non-volatile random access memory (NVRAM). Each synapse memory cell is configured to store a weight value according to an output level of a write signal. The weight value to be stored in each synapse memory cell is one value of at least three different values. The write portion is configured to write the weight value to each synapse memory cell. The write portion includes a write driver and an output controller. The write driver is configured to output the write signal to a subject synapse memory cell. The subject synapse memory cell is one of the synapse memory cells. The subject synapse memory cell is selected to store the weight value. The output controller is configured to control the output level of the write signal of the write driver. The read drivers are configured to read the weight value stored in the synapse memory cells. The write portion includes a write driver, an output controller, and a lookup table (LUT). The LUT stores a value for controlling the write signal used to update the weight value stored in the synapse memory cell. The value is determined by a device characteristic of the NVRAM in the synapse memory cell. The output controller is configured to control the output level of the write signal by referring to the LUT.

According to another embodiment of the present invention, there is provided a method for updating a memory cell. A device characteristic of a non-volatile random access memory in a memory cell is determined. A weight compensation amount is determined for the memory cell, based on the determined device characteristic. A write signal is applied to the memory cell that includes the weight compensation amount.

BRIEF DESCRIPTION OF THE DRAWINGS

FIG. 8 depicts an example of relationship between unit weights and weight regions in the range of weight values that the NVRAM can take.

DETAILED DESCRIPTION

Hereinafter, exemplary embodiments of the present invention will be described in detail with reference to the attached drawings.

It is to be noted that the present invention is not limited to the exemplary embodiments to be given below and may be implemented with various modifications within the scope of the present invention. In addition, the drawings used herein are for purposes of illustration, and do not show actual dimensions.

First Exemplary Embodiment

Figure 1:
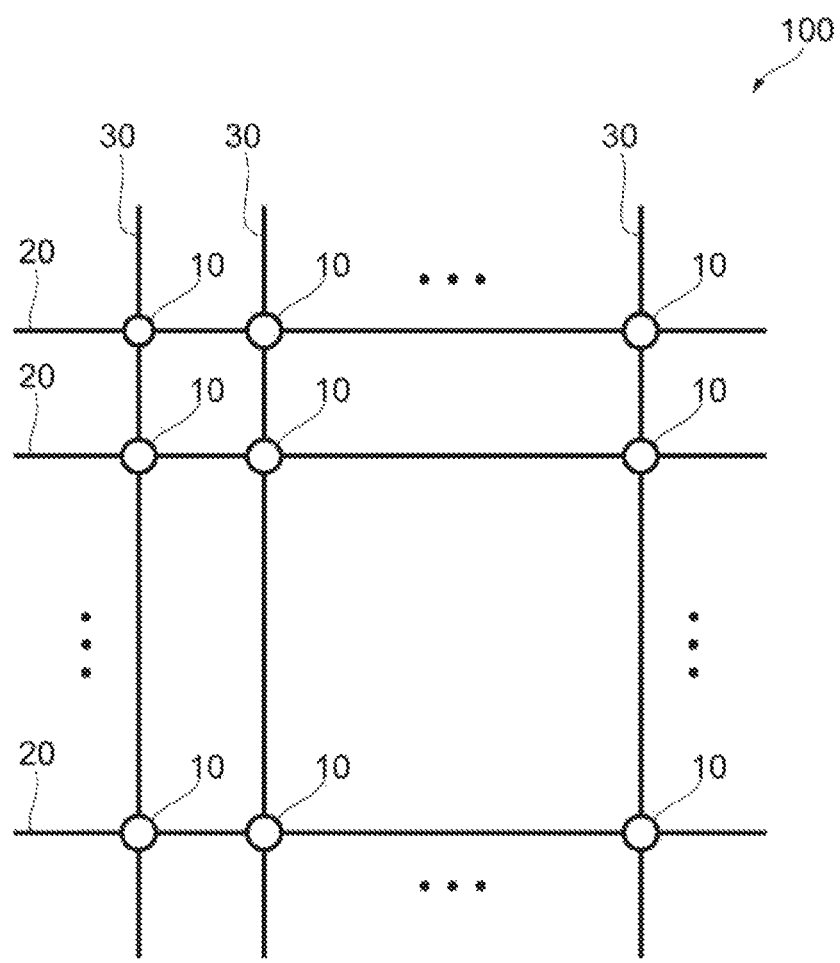
FIG. 1 depicts a synapse memory having a cross-bar array according to a first exemplary embodiment of the present invention.

FIG. 1 depicts a synapse memory 100 having a cross-bar array according to a first exemplary embodiment of the present invention.

Hardware implementation of a neuromorphic system may include synapse memories as well as neuron bodies and network connection with axons and dendrites. As shown in FIG. 1, the synapse memory 100 may include synapse memory cells 10 arranged/placed at all cross points of all axons (axon lines) 20 and all dendrites (dendrite lines) 30. Each of the synapse memory cells 10 may be configured to store a synapse weight value, which indicates a weight of synapse connection of the corresponding synapse memory cell 10. Note that the axons 20 correspond to respective axons of pre-neurons and the dendrites 30 correspond to respective dendrites of post-neurons.

In the present exemplary embodiment, the synapse memory cell 10 may be a non-volatile random access memory (NVRAM), such as a flash memory, a ferroelectric random access memory (FeRAM), a magnetoresistive random access memory (MRAM), a phase change random access memory (PRAM), and a resistive random access memory (ReRAM).

Writing data to the NVRAM is executed by applying a voltage or a current to the NVRAM. The NVRAM can store the data using a state change of a corresponding synapse memory cell 10, in response to the applied voltage or current. Note that the state change used for recording data depends on structure of the NVRAM. For example, the state change may include a change in an electrical state, a change in a magnetic state, and a change in phases.

Extent of the state change may vary depending on magnitude of the applied voltage or current, i.e. a voltage value or a current value. This enables the NVRAM to store a continuous value (analog value) or a multi-value (discrete value). Note that the NVRAM can store and hold a value being one of at least three different (not digital) values. In other words, the NVRAM can be used as an analog memory. In the example shown in the figure, the synapse memory cell 10 is constituted by the NVRAM, so that controlling the voltage value or the current value to be applied to the NVRAM enables to control the synapse weight value stored in the synapse memory cell 10. Specifically, if the voltage value is used to control write operation, a larger voltage value allows the NVRAM to store a larger synapse weight value. This tuning of the voltage (current) can be done after manufacturing of a synapse memory system 1 (described later). Note that whether to use the voltage value or the current value to control the write operation on the NVRAM can be determined based on a characteristic of the NVRAM, such as a type of change in the state used for data recording, and variation width, speed, or precision of the state change that varies depending on the voltage value or the current value.

Figure 2:
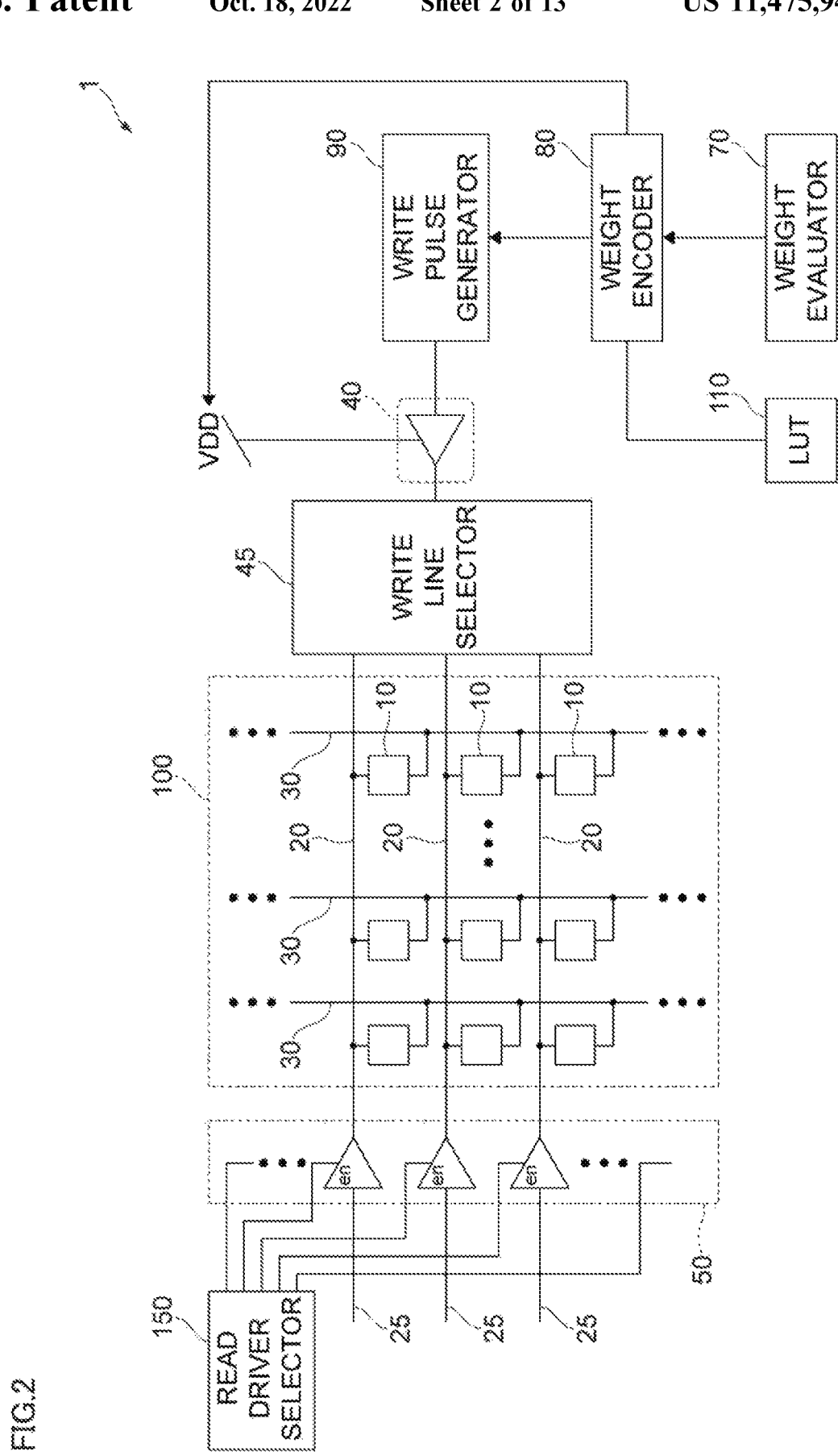
FIG. 2 depicts a synapse memory system according to the first exemplary embodiment.

FIG. 2 depicts a synapse memory system 1 according to the exemplary embodiment.

As shown in FIG. 2, the synapse memory system 1 may include the synapse memory 100, a write driver 40, a write line selector 45, read drivers 50, a read driver selector 150, a weight evaluator 70, a weight encoder 80, a write pulse generator 90, and a lookup table (LUT) 110. Note that the synapse memory system 1 can be a neuromorphic system on silicon. The synapse memory system 1 is an example of the claimed synapse memory system.

Here, as mentioned above referring to FIG. 1, the synapse memory 100 has the cross-bar array of the axons 20 and the dendrites 30, and includes the synapse memory cells 10 arranged at all cross points of the axons 20 and the dendrites 30. This exemplary embodiment assumes that writing the synapse weight value to the NVRAM is executed by controlling the voltage value.

The write driver (synapse memory cell driver) 40 is connected to the synapse memory 100. The write driver 40 may be configured to write the synapse weight value to the respective synapse memory cells 10 in response to a learning operation input. Specifically, the write driver 40 may apply the voltage to the respective axons 20 selected by the write line selector 45. The write line selector 45 selects the axons 20 to which the write driver 40 applies the voltage. For example, the write line selector 45 switches the selected axons 20 in a predetermined order at a certain timing. In this example, the weight encoder 80 controls the write driver 40 and the write line selector 45 to apply the voltage to the synapse memory cell(s) 10 provided on the axon(s) 20 selected by the write line selector 45 according to the switching timing of the write line selector 45. This enables the single pair of the write driver 40 and the write line selector 45 to write the synapse weight value to all of the synapse memory cells 10 provided on the respective axons 20.

The dendrites 30 are connected to a dendrite driver (not shown) that selects, from the dendrites 30, a subject dendrite(s) with which the synapse weight value is written in write operation or read in read operation of the synapse weight value. The dendrite driver may selectively apply the voltage to the dendrites 30. This enables the dendrite driver to determine the subject dendrite(s). Specifically, in the write operation of the synapse weight value, the dendrite driver sets one of the dendrites 30 to a ground (GND) state and sets the others of the dendrites 30 to a high impedance (Hi-Z) state. The write driver 40 then selects one of the axons 20 to apply the voltage to. This results in the synapse weight value being written in the synapse memory cell 10 on the cross point of the dendrite 30 set to the GND state and the axon 20 applied with the voltage by the write driver 40. The write driver 40 receives a pulse signal for controlling an output timing. The write driver 40 is applied with a driving voltage (VDD). Note that the write driver 40 is configured to control the voltage applied to the synapse memory cells 10.

The read drivers 50 are connected to the synapse memory 100. The read drivers 50 may be configured to read the synapse weight value from the synapse memory cells 10 in response to a recognition operation input. Specifically, the dendrite driver (not shown) sets a dendrite(s) 30 with which the synapse weight value is read to the GND state and sets the others of the dendrites 30 to the Hi-Z state. The read driver selector 150 selects or enables the read drivers 50 which correspond to the axon(s) 20 to apply the voltage to. This results in the synapse weight value being read from the synapse memory cell 10 on the cross point of the dendrite 30 set to the GND state and the axon 20 applied with the voltage by the read drivers 50. In the read operation of the synapse weight value, a total synapse weight value is read for each dendrite 30 set to the GND state. The total synapse weight value is a sum of the synapse weight values of the respective synapse memory cells 10 which are on the axon 20 being applied with the voltage.

The weight evaluator 70 may evaluate the current synapse weight value with a neuron output signal from the dendrites 30 and determine a next (updated) synapse weight value. Specifically, the weight evaluator 70 compares the neuron output signal obtained from the dendrites 30 with a desired output signal given as a learning operation input, and calculates the updated synapse weight value by which the current synapse weight value stored in the synapse memory cell 10 is to be updated.

The weight encoder 80 may encode the next synapse weight value calculated by the weight evaluator 70. The weight encoder 80 controls the driving voltage of the write driver 40 based on the next synapse weight value calculated by the weight evaluator 70. This enables the write driver 40 to control the voltage applied to the synapse memory cells 10.

The write pulse generator 90 may conduct a modulation process, such as pulse width modulation and pulse number (or frequency) modulation. In other words, the write pulse generator 90 may generate and output a pulse signal based on the encoded value generated by the weight encoder 80. This pulse signal and the driving voltage controlled by the weight encoder 80 lead the write driver 40 to update the current synapse weight value stored in the synapse memory cell 10. The write pulse generator is an example of the claimed output controller.

The LUT 110 stores compensation amounts for pulse signals generated by the write pulse generator 90. The NVRAM used as the synapse memory cell 10 has, by its nature, difficulty in incrementing or decrementing its stored weight value by a constant update amount. In view of this, the LUT 110 stores the compensation amounts required to compensate for an update amount from a current weight value, for both incrementing and decrementing directions. The write pulse generator 90 performs compensation to a write pulse signal as necessary with reference to the LUT 110 before outputting it. Details of the compensation amount, including how to set the compensation amount, will be described later.

To update the current synapse weight value, several methods can be applicable such as (i) a method adding a gap between the current synapse weight value and the next (updated) synapse weight value to the current synapse weight value, and (ii) a method setting the current synapse weight to "0", thus writing the next (updated) synapse weight value.

For example, the method (i) can be applicable to update the synapse weight value by decreasing it in the following cases. That is to say, the NVRAM used as the synapse memory cell 10 can reduce a stored value by applying a voltage having opposite polarity to a voltage applied for increasing the stored value, and a decreasing amount of the stored synapse weight value can be controlled by a value of the supply voltage.

A specific control example under the method (i) is given below.

In the method (i), several levels as to the output value of the write driver 40 can be set for controlling the synapse weight value. For example, the levels are "driver common level", "set threshold level", and "reset threshold level". The driver common level is a voltage level when the write driver 40 is in an off state (inactive). The synapse memory cell 10 is configured to keep the current weight value if the output of the write driver 40 is between the set threshold level and the reset threshold level or in high impedance (Hi-Z) state and the voltage value applied to the dendrites 30 is at the driver common level. The set threshold level, i.e. a positive threshold level, is a voltage level at or over which the write operation to increase the synapse weight value is executable. The reset threshold level, i.e. a negative threshold level, is a voltage level at or under which the write operation to decrease the synapse weight value is executable. The output value of the write driver 40 is an example of the claimed output level.

Figure 3:
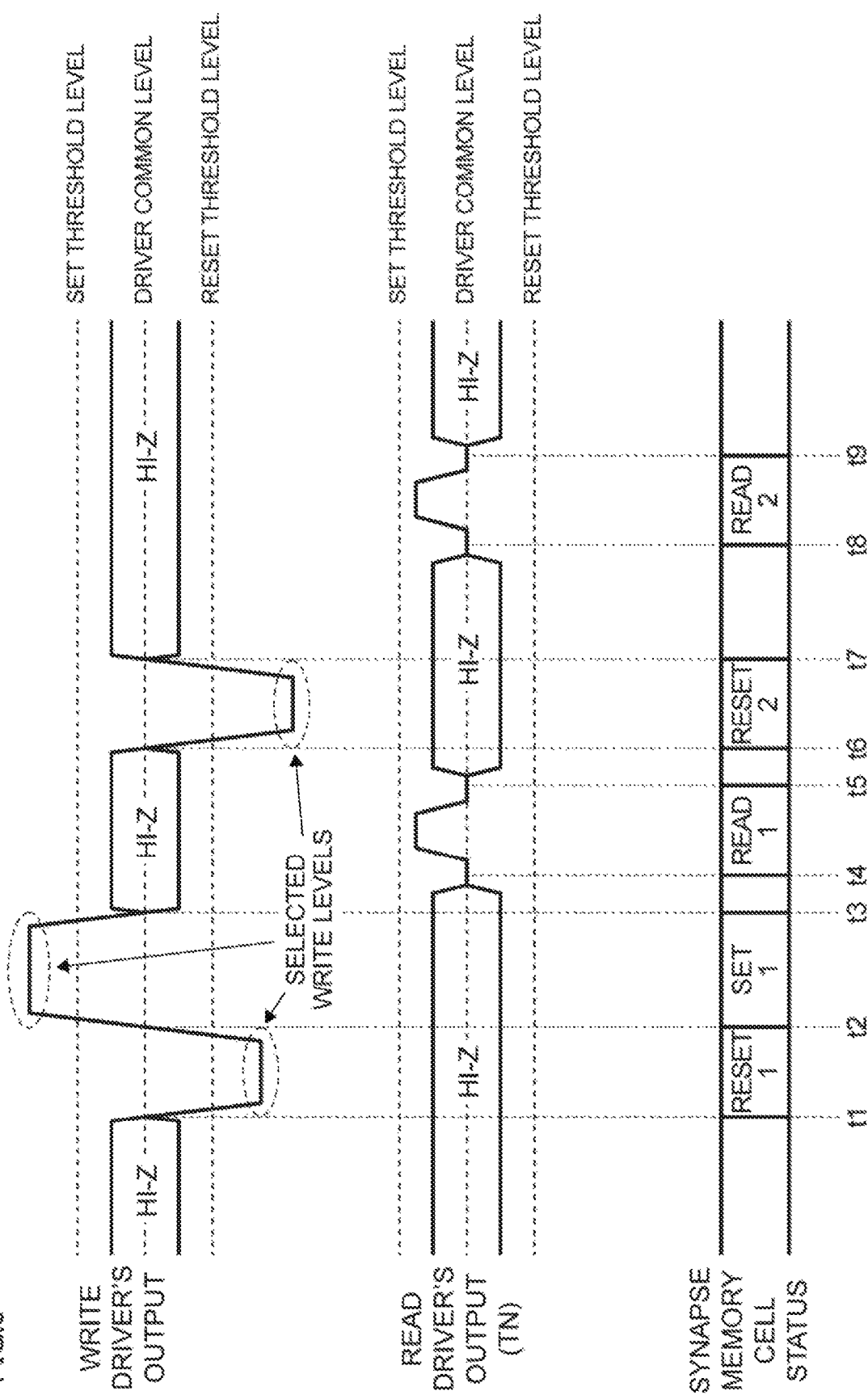
FIG. 3 depicts a timing chart for illustrating timings of signal outputs.

Referring to FIG. 3, the above method will be described in more detail. FIG. 3 is a time chart showing timings of signal outputs from the write driver 40, timings of signal outputs from the read drivers 50, and timings of state transitions of the synapse memory cell 10.

(1) First, from time t1 to time t2 (period t1-t2), the write driver 40 applies the voltage lower than the reset threshold level to the one of the synapse memory cells 10 (target cell) so that the write driver 40 sets the target cell to a reset state (a certain decremented value). That is to say, the write operation to decrease the synapse weight value is performed. The value to be decremented in the target cell depends on an amount by which the voltage applied by the write driver 40 falls below the reset threshold level. In the time chart, this operation is performed at a state "Reset1".

(2) Next, from time t2 to time t3 (period t2-t3), the write driver 40 applies the voltage higher than the set threshold level to the target cell so that the write driver 40 sets the target cell to a set state (a certain incremented value). That is to say, the write operation to increase the synapse weight value is performed. The value to be incremented in target cell depends on an amount by which the voltage applied by the write driver 40 exceeds the set threshold level. In the time chart, this operation is performed at a state "Set1".

(3) Next, from time t4 to time t5 (period t4-t5), the read drivers 50 apply the voltage between the driver common level and the set threshold level to the target cell so that the read drivers 50 set the target cell to a read state. That is to say, the read operation of the synapse weight value is performed. If the target cell read in this state is the same one that was written in the "Set1" state, the value to be read at this point corresponds to the synapse weight value updated at the above step (2). In the time chart, this operation is performed at a state "Read1".

(4) Next, from time t6 to time t7 (period t6-t7), the write driver 40 applies the voltage lower than the reset threshold level to the target cell so that the write driver 40 sets the target cell to another reset state to another decremented value. That is to say, the write operation to decrease the synapse weight value is performed. In the time chart, this operation is performed at a state "Reset2".

(5) Next, from time t8 to time t9 (period t8-t9), the read drivers 50 apply the voltage between the driver common level and the set threshold level to the target cell so that the read drivers 50 set the target cell to another read state. That is to say, the read operation of the synapse weight value is performed. If the target cell read in this state is the same one that was written in the "Reset2" state, the value to be read at this point corresponds to the synapse weight value updated at the above step (4). In the time chart, this operation is performed at a state "Read2".

(6) In a period other than the periods t1-t2, t2-t3, and t6-t7, the target cell is set to the high impedance (Hi-Z) state against the write driver 40. That is to say, the write operation is not performed in the period. Further, in a period other than the periods t4-t5 and t8-t9, the target cell is set to the high impedance state against the read drivers 50. That is to say, the read operation is not performed in the period.

When the write driver 40 is in the off state, the applied voltage to the synapse memory cell 10 is between the set threshold level and the reset threshold level or in high impedance state and the synapse memory cell 10 keeps the current weight value. This prevents the write operation of the synapse weight value.

In response to an output signal from the write driver 40, the applied voltage shifts from the driver common level to or above the set threshold level or to or below the reset threshold level.

When the voltage applied by the write driver 40 exceeds the set threshold level, the synapse weight value is updated to be increased. An amount of the increment depends on an amount by which the voltage applied by the write driver 40 exceeds the set threshold level. That is to say, controlling the exceeding amount by adjusting the voltage applied by the write driver 40, namely by selecting a write level, enables to control the increment amount of the synapse weight value.

When the voltage applied by the write driver 40 falls below the reset threshold level, the synapse weight value is updated to be decreased. An amount of the decrement depends on an amount by which the voltage applied by the write driver 40 falls below the reset threshold level. That is to say, controlling the falling amount by adjusting the voltage applied by the write driver 40, namely by selecting a write level, enables control of the decrement amount of the synapse weight value.

Note that if the applied voltage is in a range between the set threshold level and the reset threshold level, the synapse weight value is maintained. In other words, the write operation on the synapse memory cell 10 is not conducted. The read drivers 50 read the synapse weight value from the synapse memory cells 10 by applying the voltage in this range to the synapse memory cells 10.

Below a description will be given of compensation for a synapse weight update amount.

In addition to minimizing the chip-to-chip or wafer-to-wafer characteristic variation of the NVRAMs, a synapse unit weight update amount can be constant for both increasing and decreasing directions, regardless of a current weight value, or to be controllable if it is difficult to keep the value constant.

In the present embodiment, the LUT 110 storing compensation amounts is prepared, and with reference to this LUT 110, a write pulse signal is compensated for before updating the weight value in each synapse memory cell 10.

In updating (writing) a synapse weight, one or more additional features of the write pulse signal are used so that the signal can compensate for the characteristic of the synapse memory cell 10. For example, if the number of pulses is already used for operation, pulse width or height (or both of them) may be used for the compensation. The compensation may be applied at every unit weight update. The compensation amount may be determined by the update amount difference between target (ideal) and measured data.

Below a detailed description will be given of compensation for the weight value in the synapse memory cell 10.

The compensation amount may be prepared, for example, for several segmented weight regions (described later) and stored in the LUT 110, which is accessed at every unit weight update.

Figure 4:
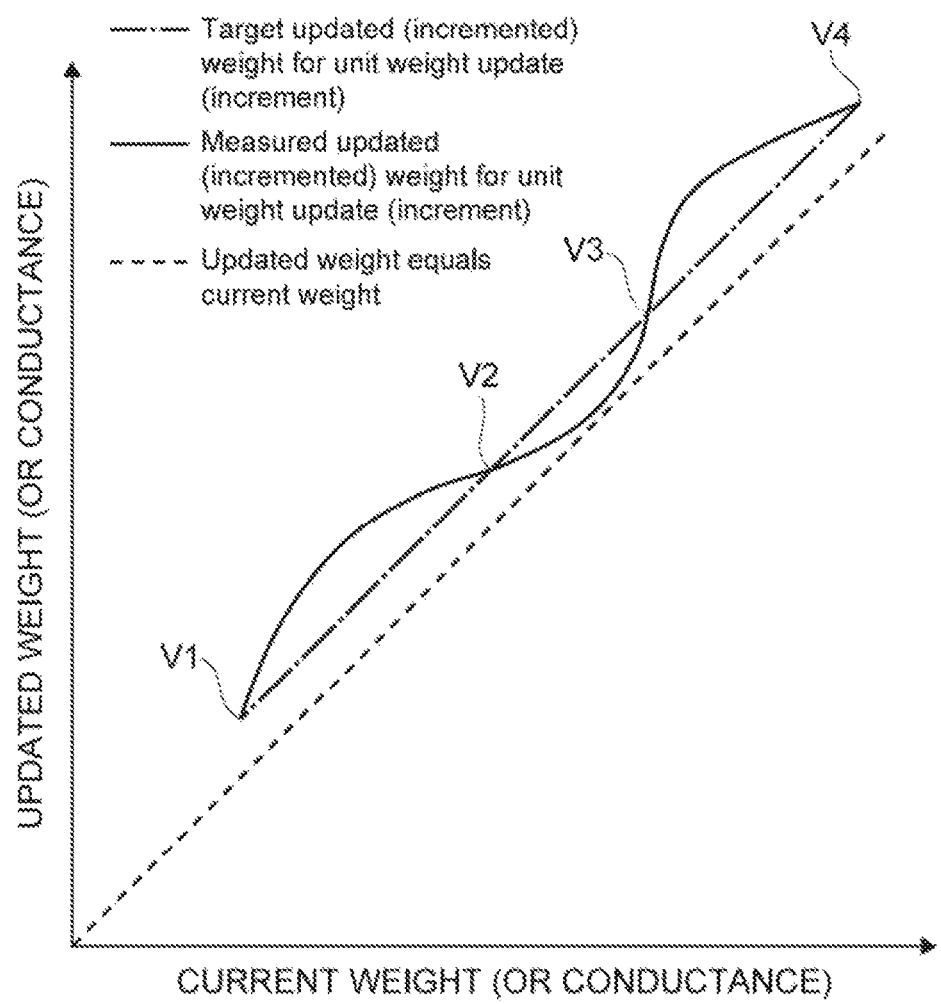
FIG. 4 depicts an example of device characteristic of an NVRAM.
Figure 5:
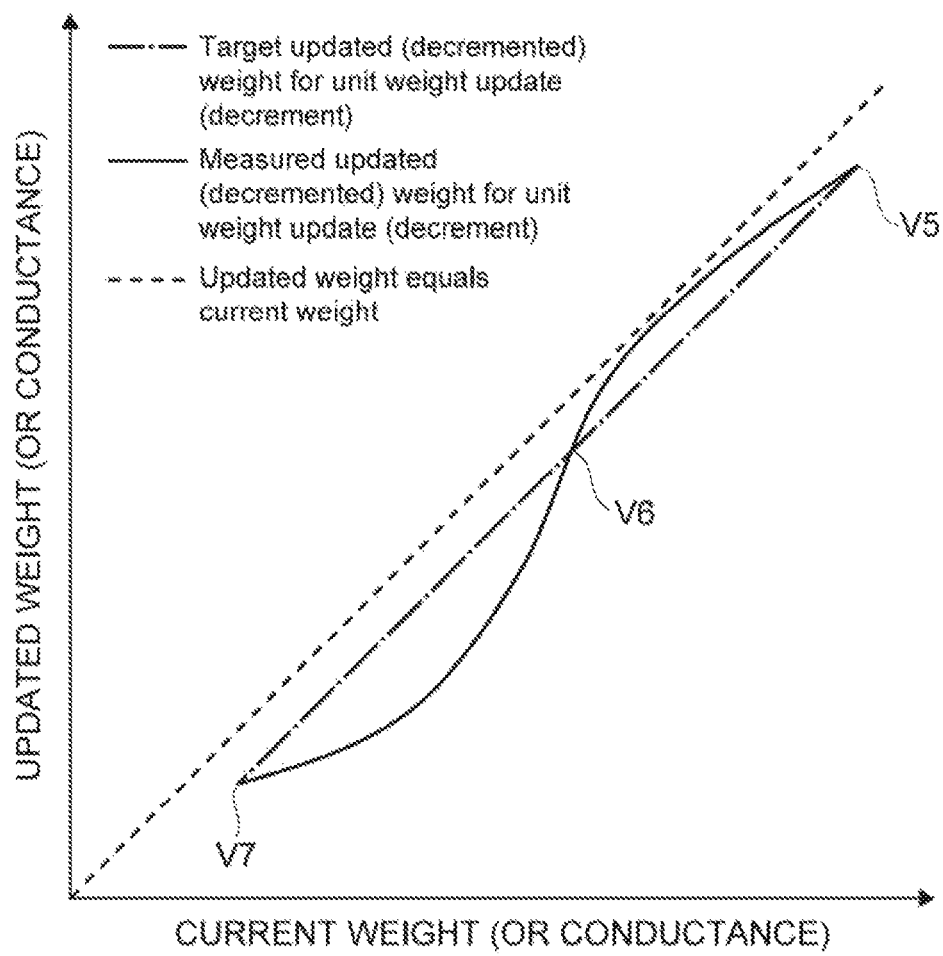
FIG. 5 depicts an example of device characteristic of the NVRAM.

FIGS. 4 and 5 each depict an example of device characteristic of the NVRAM. FIG. 4 depicts an example of device characteristic of the NVRAM when the weight value is incremented. FIG. 5 depicts an example of device characteristic of the NVRAM when the weight value is decremented.

In the graphs shown in FIGS. 4 and 5, the horizontal axis represents a current weight value (or conductance), and the vertical axis represents an updated weight value (or conductance). In FIGS. 4 and 5, the dashed line represents a weight value where the current weight value equals the updated weight value. In FIG. 4, the dash-dotted straight line represents a target value of the updated weight value when a current weight value is to be incremented by a unit weight update (increment) amount, and the solid curved line represents a measured value of the updated weight value for unit weight update (increment) when a current weight value is actually incremented by a unit weight update (increment) amount. In FIG. 5, the dash-dotted straight line represents a target value of the updated weight value when a current weight value is decremented by a unit weight update (decrement) amount, and the solid curved line represents a measured value of the updated weight value for unit weight update (decrement) when a current weight value is actually decremented by a unit weight update (decrement) amount.

As shown in FIG. 4, the measured updated weight value incremented by a unit weight update (increment) amount from a given current weight value can deviate from the target updated weight value. The amount of deviation varies in accordance with the current weight value before the update. In the example shown in FIG. 4, when the current weight value is between v1 and v2 or between v3 and v4, the measured value is larger than the target value. This means that the amount of change in the weight value by the update is more than targeted. Meanwhile, when the current weight value is between v2 and v3, the measured value is smaller than the target value. This means that the amount of change in the weight value by the update is less than targeted.

As shown in FIG. 5, the measured updated weight value decremented by a unit weight update (decrement) amount from a given current weight value can deviate from the target updated weight value. The amount of deviation varies in accordance with the current weight value before the update. In the example shown in FIG. 5, when the current weight value is between v5 and v6, the measured value is larger than the target value. This means that the amount of change in the weight value by the update is less than targeted. Meanwhile, when the current weight value is between v6 and v7, the measured value is smaller than the target value. This means that the amount of change in the weight value by the update is more than targeted.

Below a description will be given of a method for determining a compensation amount.

Figures 6A, 6B:
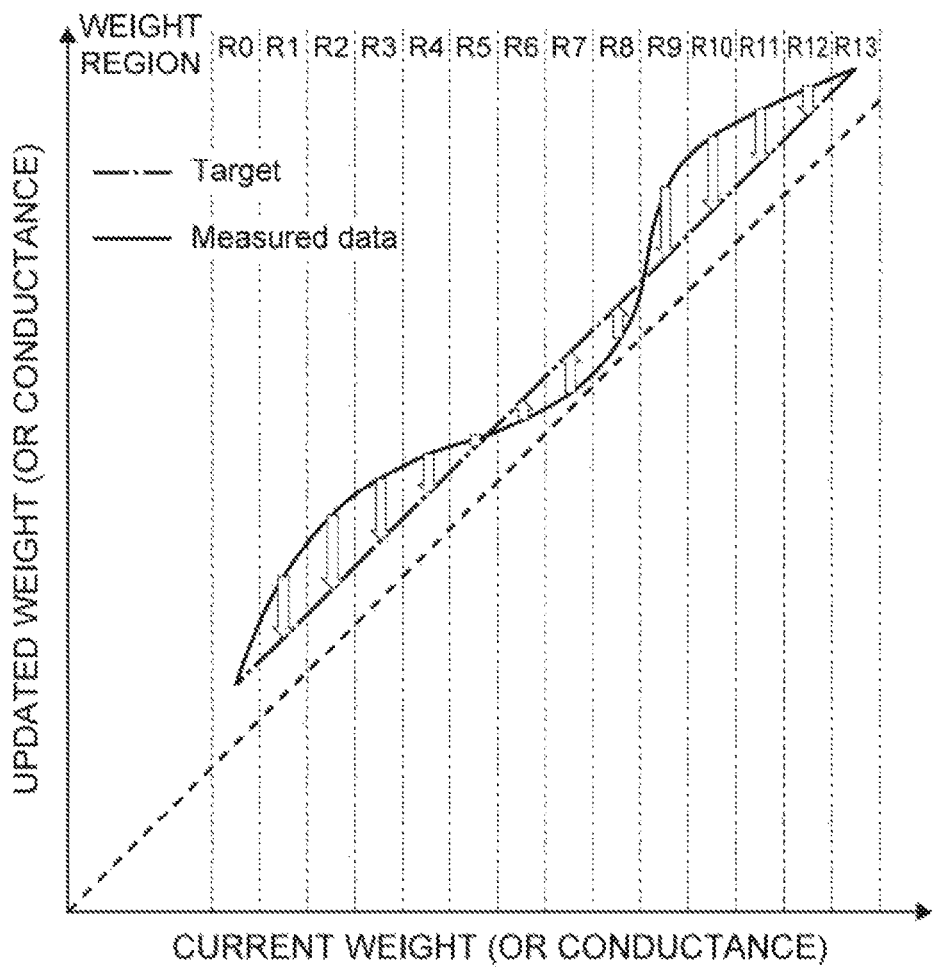
FIGS. 6A and 6B depict an example of an update amount compensation method applied to the NVRAM having the device characteristic shown in FIG. 4
Figures 7A, 7B:
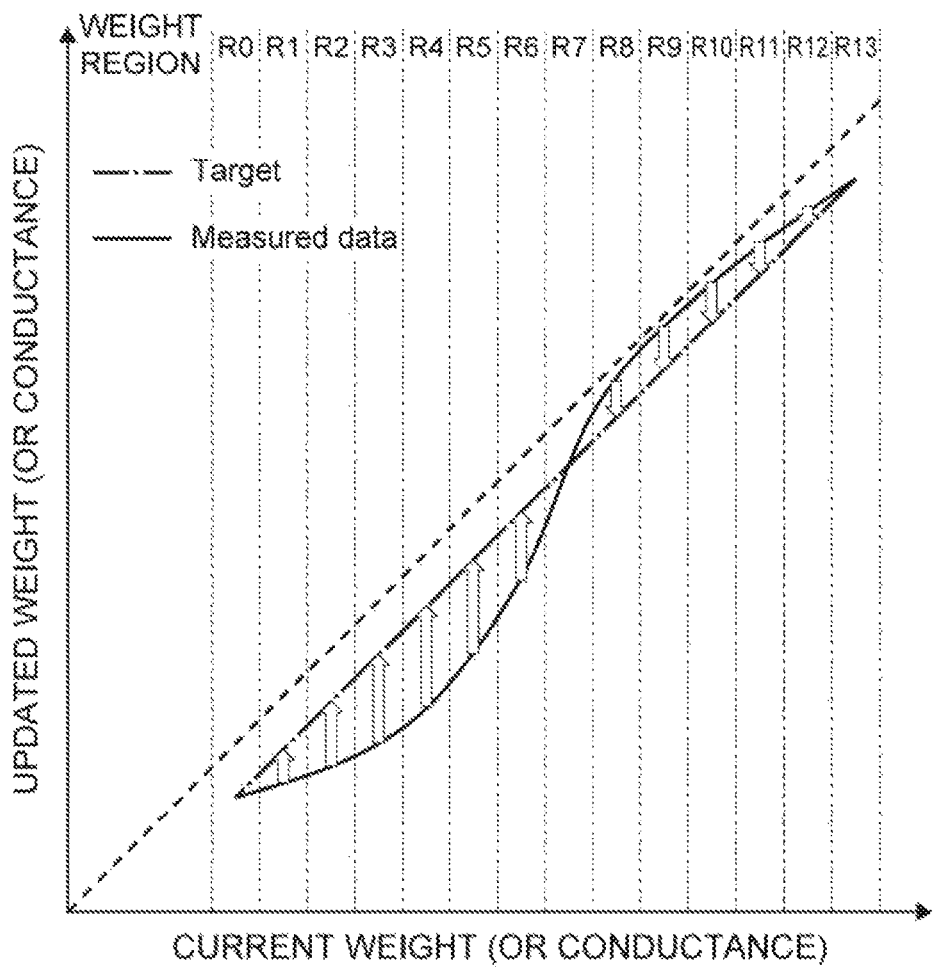
FIGS. 7A and 7B depict an example of an update amount compensation method applied to the NVRAM having the device characteristic shown in FIG. 5.

FIGS. 6A and 6B depict an example of an update amount compensation method applied to the NVRAM having the device characteristic shown in FIG. 4. FIGS. 7A and 7B depict an example of an update amount compensation method applied to the NVRAM having the device characteristic shown in FIG. 5. FIG. 6A shows a graph representing a compensation method when incrementing the weight value, and FIG. 6B shows an example of the LUT 110 storing compensation amounts corresponding to the graph of FIG. 6A. FIG. 7A shows a graph representing a compensation method when decrementing the weight value, and FIG. 7B shows an example of the LUT 110 storing compensation amounts corresponding to the graph of FIG. 7A.

In the example shown in FIG. 6A, the range of weight values that the NVRAM can take is segmented into 14 equal weight regions, including regions R0 to R13. The region R0 contains the minimum weight value that the NVRAM can take. The region R13 contains the maximum weight value that the NVRAM can take. Each weight region is assigned for multiple unit weights. The unit weight amount is a minimum unit by which a weight value stored in the NVRAM is updated, and defined based on resolution of weight values for the NVRAM. The relationship between the weight regions and the unit weights will be described later.

Referring to FIG. 6A, in incrementing the weight value, the measured value in the regions R1 to R5 is larger than the target value, meaning that compensation to reduce the updated weight value is required. In FIG. 6A, this compensation is indicated by downward arrows. Meanwhile, the measured value in the regions R6 to R8 is smaller than the target value, meaning that compensation to increase the updated weight value is required. In FIG. 6A, this compensation is indicated by upward arrows. Also, the measured value in the regions R9 to R12 is larger than the target value, meaning that compensation to reduce the updated weight value is required. In FIG. 6A, this compensation is indicated by downward arrows. In the regions R0 and R13, the measured value equals the target value, meaning that no compensation is required.

The compensation amount in each weight region is determined based on difference between the measured value and the target value. The LUT 110 stores the compensation amounts (compensation values) for respective weight regions shown in FIG. 6B. Each compensation amount stored in the LUT 110 is applied to an updated weight value when any weight value in the NVRAM is incremented by a unit weight amount. Note that the unit of the compensation amount is determined by which feature of the write pulse signal is used for the compensation, such as pulse width and pulse height.

In the example shown in FIG. 7A, the range of weight values that the NVRAM can take is segmented into 14 equal weight regions, including regions R0 to R13, similarly to the example shown in FIG. 6A.

Referring to FIG. 7A, in decrementing the weight value, the measured value in the regions R12 to R8 is larger than the target value, meaning that compensation to reduce the updated weight value is required. In FIG. 7A, this compensation is indicated by downward arrows. Meanwhile, in the regions R6 to R1, the measured value is smaller than the target value, meaning that compensation to increase the updated weight value is required. In FIG. 7A, this compensation is indicated by upward arrows. In the regions R13, R7, and R0, the measured value equals the target value, meaning that no compensation is required.

The compensation amount in each weight region is determined based on difference between the measured value and the target value. The LUT 110 stores the compensation amounts (compensation values) for respective weight regions shown in FIG. 7B. Each compensation amount stored in the LUT 110 is applied to an updated weight value when any weight value in the NVRAM is decremented by a unit weight amount.

FIG. 8 shows an example of a relationship between the weight step and the weight regions, in a range of weight values that the NVRAM can take. Here, change in the weight value (either in increment or decrement) is performed on a unit weight basis. This change in the weight value by the unit weight is referred to as an update step, and a step number is assigned to each weight value that the NVRAM can take, in order from minimum to maximum. In the example shown in FIG. 8, one weight region is assigned to every ten weight step. More specifically, the region R0 is assigned to steps 0 to 9, the region R1 is assigned to steps 10 to 19, and the region R13 is assigned to steps 130 to 139. Likewise, the other regions R2 to R12 are assigned to the respective ten steps in this manner.

The compensation amount for an updated weight value is set for each weight region. In other words, in update steps in a given weight region, every update of a weight value is compensated for by the compensation amount set for that weight region. The compensation amount set for a given weight region may be an average of differences between the measured value and the target value in each update step included in that weight region, for example. Setting the compensation amount for every weight region corresponding to multiple update steps can reduce the data size of the LUT 110.

The compensation for the weight value in the NVRAM (synapse memory cell 10) has been described above, but the measured values of the updated weight values shown in FIGS. 4 and 5, the number of segmentations of the weight values that the synapse memory cell 10 can take shown in FIGS. 6 and 7, and the number of update steps corresponding to one weight region shown in FIG. 8, are by way of example only, and specific values and numbers are not limited to those shown in the figures.

Below a description will be given of a procedure for setting the compensation amount for the weight value in each synapse memory cell 10. This setting of the compensation amount is made during wafer or module test of the synapse memory 100, for example.

Figure 9:
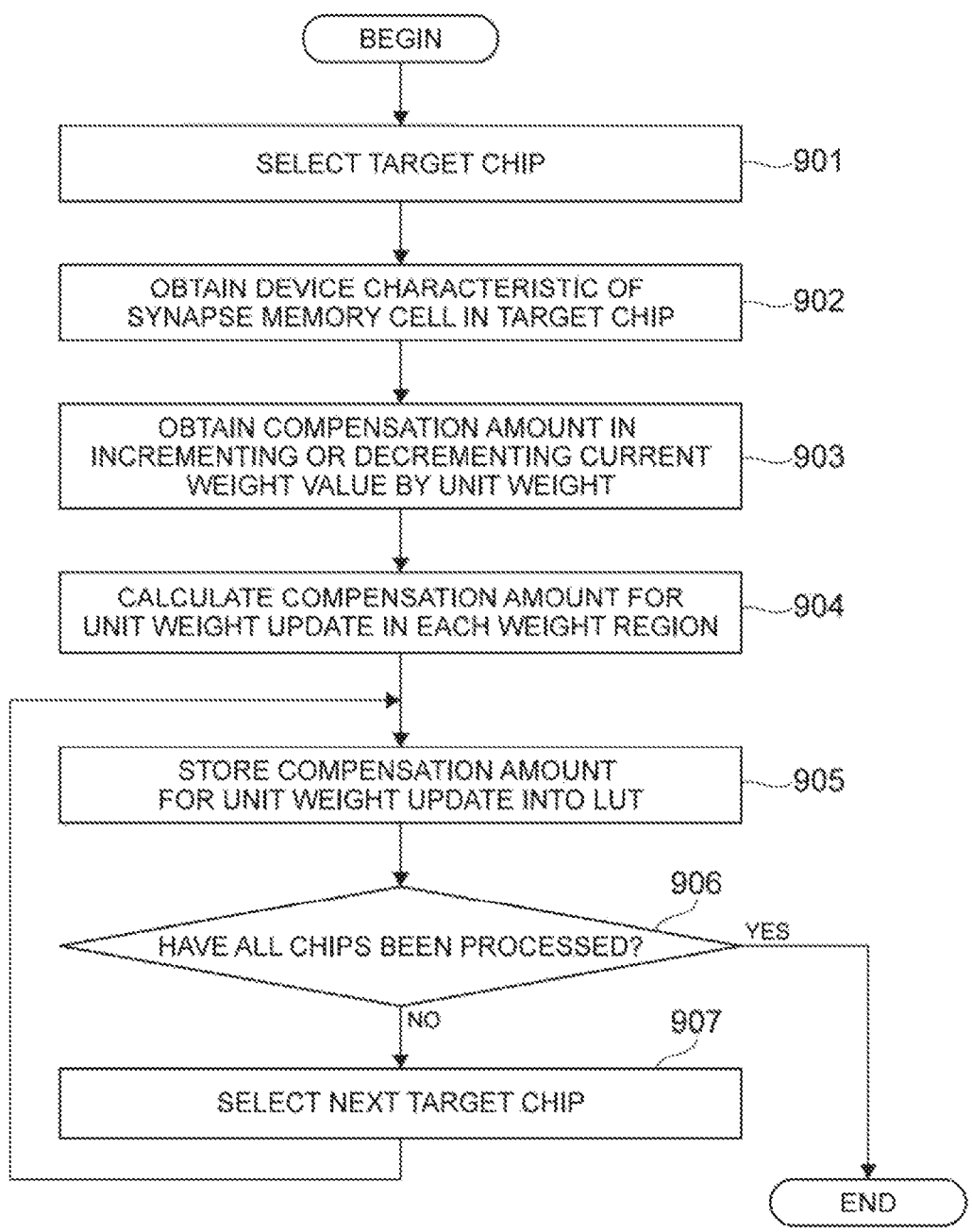
FIG. 9 depicts a flowchart of a procedure for setting a compensation amount.

FIG. 9 is a flowchart of a procedure for setting the compensation amount into the LUT 110. This flow is mostly applied at wafer or module test just after manufacturing by manufacturer side. In the example shown in FIG. 9, the compensation amount is set for multiple chips (synapse memories 100) manufactured on a wafer, for example.

First, one of the multiple synapse memory systems 1 produced on the wafer is selected as a target chip (S901).

Then, a synapse memory cell 10 (a device) in the target chip undergoes device measurement, whereby the device characteristic of the device within the range of weight values that the device can take is obtained (S902).

Then, a compensation amount in incrementing or decrementing a current weight value by the unit weight is obtained for the entire range of weight values that the device can take (S903).

Then, for each predefined weight region, a compensation amount for unit weight update is calculated (S904). Specifically, from the compensation amounts obtained in S903, an average compensation amount may be calculated for unit weight update from each current weight included in each weight region, for example.

Then, for each weight region, the compensation amount for unit weight update calculated in S904 is stored into the LUT 110 (S905).

If there is an unprocessed chip(s) (No in S906), such an unprocessed chip is selected as the next target chip (S907), and the compensation amount for each weight region obtained by the steps S902 to 904 is stored into the LUT 110 (S905).

The compensation amount is stored for the unprocessed chip(s) one by one, and if there is no unprocessed chip (Yes in S906), the procedure ends.

In the above procedure, obtaining the device characteristic of the selected synapse memory cell 10, calculating the compensation amount for each weight region in the selected synapse memory cell 10, and writing the calculated compensation amount into the LUT 110 are performed by, for example, a device that is different from the synapse memory system 1.

Figure 10:
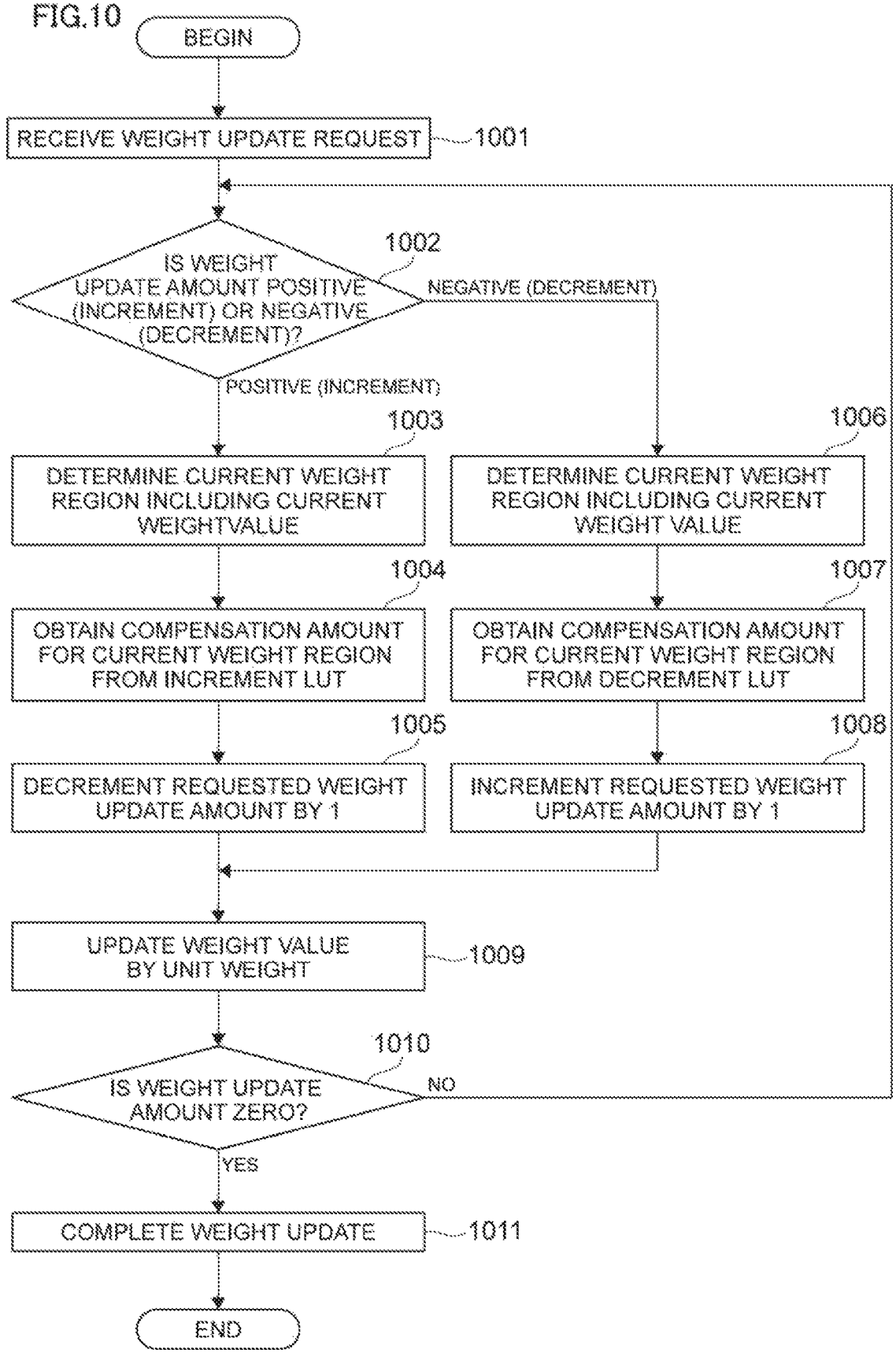
FIG. 10 depicts a flowchart of a procedure for updating a weight value.

A description will now be given of an operation to update a weight value in each synapse memory cell 10 in the synapse memory 100. FIG. 10 is a flowchart of a procedure for updating a weight value in the synapse memory cell 10 with the compensation amount in the LUT 110 set through the flowchart in the FIG. 9. This flow is mostly applied at characterization of the memory system 1 by user side. Every time the weight update is made, the change in the weight value is compensated for by a compensation amount with reference to the LUT 110.

First, the synapse memory system 1 receives a request for a weight update to a current weight value in one synapse memory cell 10 in the synapse memory 100 (S1001). The update request includes an update amount from the current weight value. The update amount is specified by multiples of the unit weight. In other words, the update amount is specified by the number of update steps explained with reference to FIG. 8. Note that the update amount may take a positive value when incrementing the current weight value and take a negative value when decrementing the current weight value.

If the requested weight update involves increment of the current weight value (positive (increment) in S1002), the weight evaluator 70 determines a current weight region including the current weight value (S1003) and sends the results to the weight encoder 80.

Then, the weight encoder 80 obtains a compensation amount set for the current weight region from the LUT 110 prepared for weight increment (S1004).

Also, the weight evaluator 70 decrements the requested update amount by one (S1005).

Then, the weight encoder 80 also calculates a weight compensation encoded value for incrementing the current weight value by the unit weight, on the basis of the current weight value and the compensation amount identified by the weight evaluator 70.

Then, the write pulse generator 90 outputs a write pulse according to the weight encoder 80 to update the weight value by the unit weight (S1009).

As the update by the unit weight has been completed above, the synapse memory system 1 determines whether the update amount (requested update amount) decremented in S1005 equals zero (S1010).

If the update amount is not zero (No in S1010), the process returns to S1002 and repeats the update by the unit weight.

If the update amount is zero (Yes in S1010), the update of the weight value according to the update request has been completed. This ends the process (S1011).

On the other hand, if the requested weight update involves decrement of the current weight value (negative (decrement) in S1002), the weight evaluator 70 determines a current weight region including the current weight value (S1006) and sends the results to the weight encoder 80.

Then, the weight encoder 80 obtains a compensation amount set for the current weight region from the LUT 110 prepared for weight decrement (S1007).

Also, the weight evaluator 70 increments the requested update amount by one (S1008).

Then, the weight encoder 80 and the write pulse generator 90 update the weight value by the unit weight (S1009), and the synapse memory system 1 determines whether the update amount (requested update amount) incremented in S1008 equals zero (S1010). If the update amount is zero, the process ends (S1011).

Figure 11:
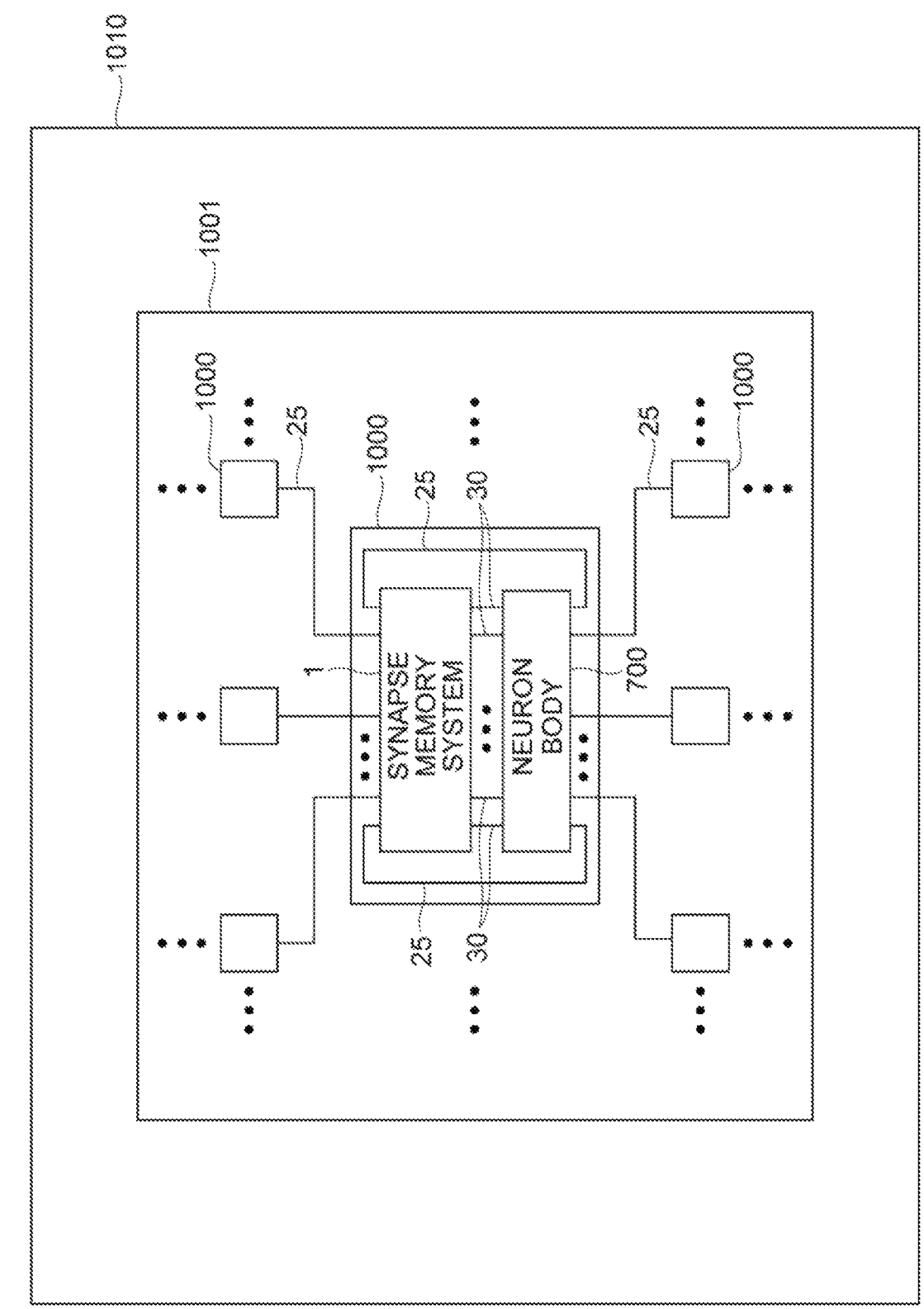
FIG. 11 depicts an example of a device which includes a neuro-synaptic core system.

FIG. 11 depicts an example of a device 1010 which includes the neuro-synaptic core system 1000.

As shown in FIG. 11, the synapse memory system 1 may be provided on the device 1010, such as a computer. In the shown example, multiple neuro-synaptic core systems 1000 are provided on a chip 1001, such as a semiconductor chip. The chip 1001 is then mounted on the device 1010.

Each of the neuro-synaptic core systems 1000 includes the synapse memory system 1 and a neuron body 700. The neuron body 700 performs neuron operations. Specifically, the neuron body 700 obtains the product-sum value of the synapse weight value and input value based on the total current sensed by the current sensor. The total current sensed by the current sensor may represent the product-sum value of the synapse weight values stored in the synapse memory cells 10 on the cross points of the selected axon(s) 20 and the dendrites 30 and the input values. Then, the neuron body 700 outputs neuron output corresponding to the total current value.

Here, the neuro-synaptic core systems 1000 are connected to each other via pre-driven axons 25. The synapse memory system 1 is connected to a neuron body 700 via the pre-driven axon 25. The neuron body 700 generates the output, that is pre-driven axon 25, which is connected to a synapse memory system 1 in the same or other neuro-synaptic core systems 1000. The synapse memory system 1 receives an output signal from the neuron body 700 to accumulate the weight values of the synapses whose inputs are activated via their axons 20. If the accumulated value of the multiplied value of synapse weight value and input value from the axon 20 (or the pre-driven axon 25) reaches a predetermined threshold, the neuron body 700 outputs the output signal as the neuron output at the pre-driven axon 25.

Second Exemplary Embodiment

In the first embodiment explained with reference to FIGS. 2 to 7, the LUT 110 includes the LUT 110 for weight increment and the LUT 110 for weight decrement. And, as explained with reference to FIG. 8, the compensation amount is identified for one synapse memory 100 on the basis of the measured value, and the obtained compensation amount is recorded in the LUT 110 which is included in the same synapse memory system 1.

Device characteristics of synapse memory cells 10 in a synapse memory 100 are not so different. Thus, there is no practical problem with applying one set of compensation amounts obtained from one synapse memory cell 10 to another synapse memory cell 10 in the same synapse memory 100. Of course, different sets of compensation amounts can be prepared in the same LUT 110 and they can be used for individual compensation each cell by cell; however, it is determined by considering the trade-off between the size of LUT 110 and the compensation accuracy.

However, multiple neuro-synaptic core systems 1000 manufactured on a wafer have slightly different device characteristics from each other depending on their respective positions on the wafer. Also, neuro-synaptic core systems 1000 manufactured on different wafers have slightly different device characteristics from each other. Thus, using compensation amounts for individual synapse memories 100 in those neuro-synaptic core systems 1000 may allow for more accurate compensation.

In the second embodiment, in setting compensation amounts for weight values in synapse memory cells 10 in a particular synapse memory 100, during wafer or module test thereof, selection can be made between whether the same compensation amounts set for another synapse memory 100 are to be stored in its LUT 110 and whether compensation amounts set specifically for that particular synapse memory 100 according to its device characteristic are to be stored in its LUT 110.

The configuration of the synapse memory system 1 according to the second embodiment is the same as that shown in FIG. 2.

Figure 12:
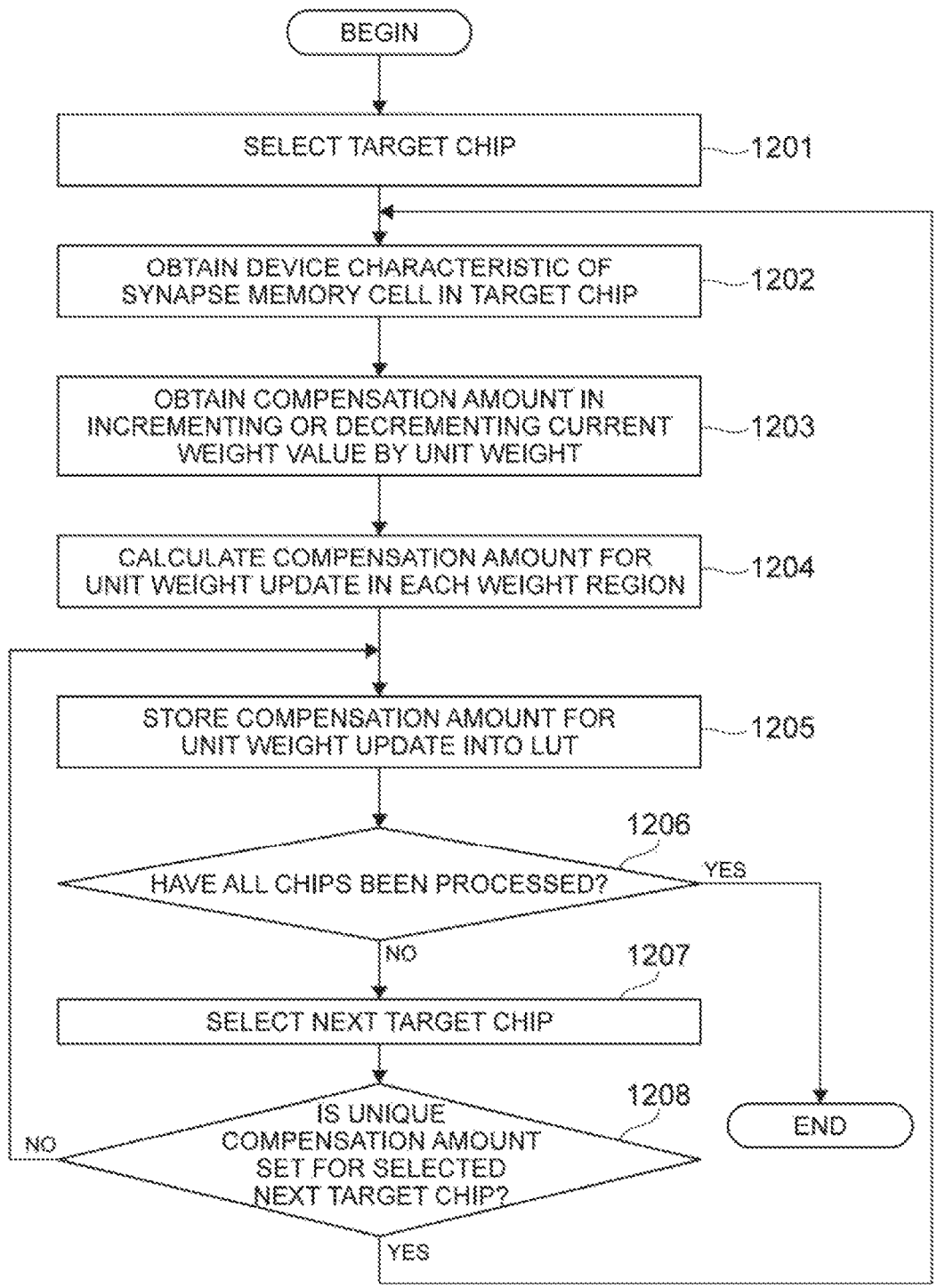
FIG. 12 depicts a flowchart of a procedure for setting a compensation amount according to a second exemplary embodiment.

FIG. 12 is a flowchart of a procedure for setting a compensation amount according to the second embodiment.

In the flowchart, steps S1201 to S1205 are the same as steps S901 to S905 shown in FIG. 9.

If there is an unprocessed chip (No in S1206), such an unprocessed chip is selected as the next target chip (S1207). Then, selection is made as to whether a unique compensation amount is set for this selected target chip. For example, this selection may be made by an administrator or an operator during wafer or module test of the synapse memories 100.

If the unique compensation amount is set (Yes in S1208), the process returns to S1202, and a compensation amount for unit weight update is calculated for each weight region and stored into the LUT 110 (S1202 to S1205) of the next chip.

On the other hand, if the unique compensation amount is not set (No in S1208), the process returns to S1205, and the same compensation amount set for a previous target chip is stored into the LUT 110 of the next chip.

If there is no unprocessed chip (Yes in S1206), the process ends.

Third Exemplary Embodiment

In the first and the second embodiments, compensation amounts are set and stored in the LUT 110 at the wafer or module test of the synapse memories 100. However, after implementation of the synapse memory system 1 including the synapse memories 100, the compensation amounts may be reset at appropriate timing by updating the LUT 110. For example, the timing to reset the compensation amounts may be when the synapse memory system 1 is used for the first time. Alternatively, the timing may be when the synapse memory system 1 is used for the first time since the system 1 has been used a predetermined number of times. Still alternatively, the timing may be when the synapse memory system 1 is used for the first time since the system 1 has been in operation for predetermined hours. Note that these reset timings are by way of example only and not of limitation. Actually, the reset timing can be set according to the specifications or operating modes of the synapse memory system 1 or a device on which the synapse memory system 1 is implemented.

Figure 13:
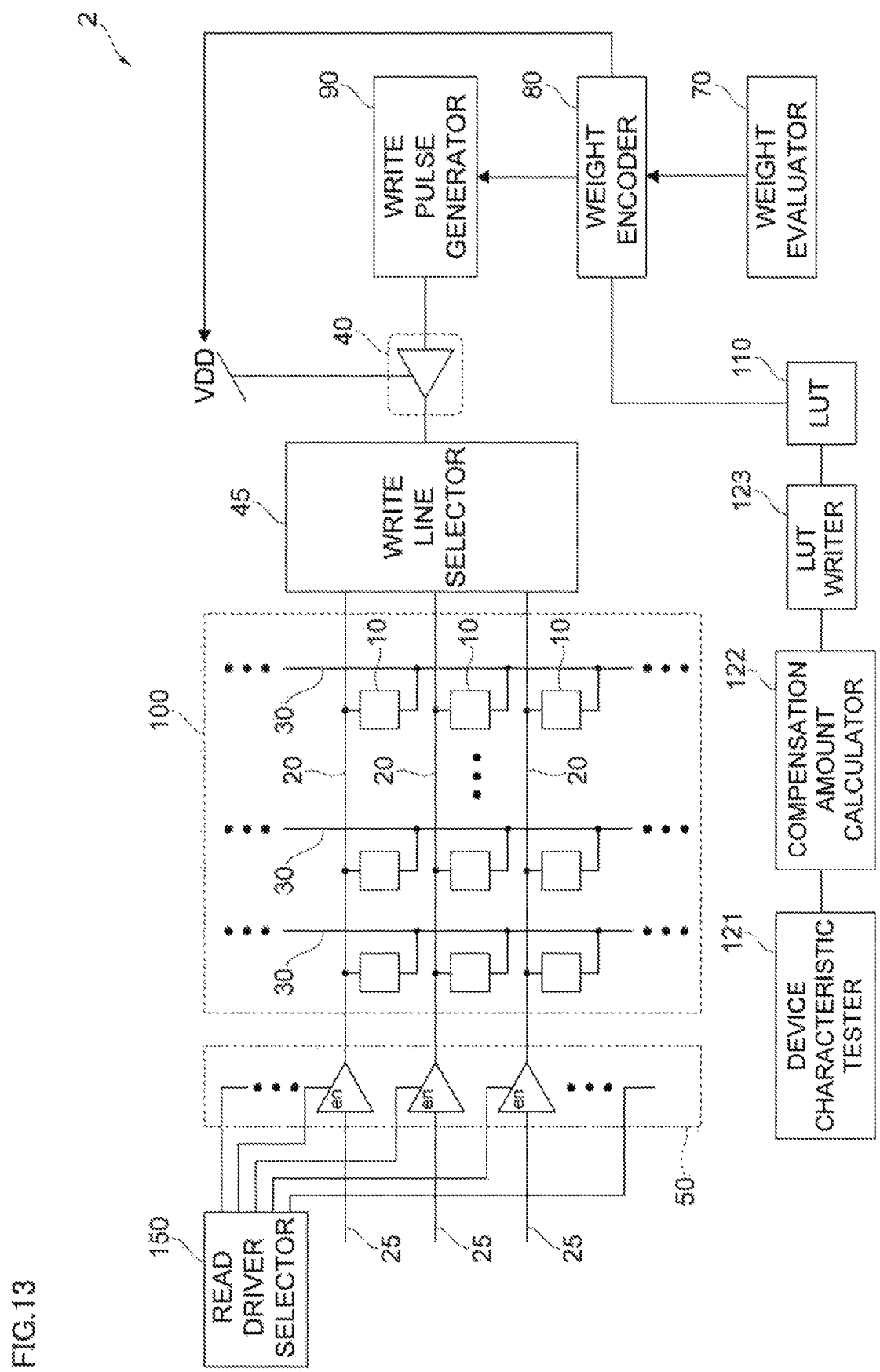
FIG. 13 depicts a configuration of a synapse memory system according to a third exemplary embodiment.

FIG. 13 illustrates a configuration of a synapse memory system 2 according to the third embodiment.

Besides the components of the synapse memory system 1 shown in FIG. 2, the synapse memory system 2 shown in FIG. 13 includes a device characteristic tester 121, a compensation amount calculator 122, and an LUT writer 123.

The device characteristic tester 121 performs a device measurement on a synapse memory cell 10 in the synapse memory 100 of the system 2 in which the device characteristic tester 121 is provided, and obtains the device characteristic of that synapse memory cell 10 within the range of weight values that the synapse memory cell 10 can take.

The compensation amount calculator 122 obtains memory cell characteristics applied in incrementing or decrementing a current weight value by the unit weight, over the entire range of weight values that the synapse memory cell 10 having undergone the device measurement can take. On the basis of the obtained memory cell characteristics, the compensation amount calculator 122 also calculates a compensation amount for unit weight update for each weight region in the synapse memory cell 10.

The LUT writer 123 writes the compensation amount for unit weight update calculated by the compensation amount calculator 122 into the LUT 110 for every weight region in the synapse memory cell 10.

When predetermined conditions for updating the LUT 110, such as the aforementioned timings to reset the compensation amount, are satisfied, the device characteristic tester 121, the compensation amount calculator 122, and the LUT writer 123 operates to update the LUT 110. The update of the LUT 110 is performed according to the steps S902 to S905 of FIG. 9, for example.

In FIG. 13, the synapse memory system 2 includes the device characteristic tester 121, the compensation amount calculator 122, and the LUT writer 123. However, each of the device characteristic tester 121, the compensation amount calculator 122, and the LUT writer 123 may be external to the device in which the synapse memory system 2 is implemented.

What is claimed is:

1. A synapse memory system comprising:
a plurality of synapse memory cells, each synapse memory cell comprising a non-volatile random access memory (NVRAM), each synapse memory cell being configured to store a weight value according to an output level of a write signal, the weight value to be stored in each synapse memory cell being one value of at least three different values;
a write portion configured to write the weight value to each synapse memory cell, the write portion comprising a write driver and an output controller, the write driver being configured to output the write signal to a subject synapse memory cell, the subject synapse memory cell being one of the synapse memory cells, the subject synapse memory cell being selected to store the weight value, the output controller being configured to control the output level of the write signal of the write driver; and
read drivers configured to read the weight value stored in the synapse memory cells,
wherein the output controller is configured to compensate for the output level of the write signal in updating the weight value stored in the synapse memory cell, according to a device characteristic of the NVRAM in the synapse memory cell, wherein the output controller is configured to compensate for the output level of the write signal every time, responsive to updates to the weight value stored in the synapse memory cell, and
wherein the output controller is configured to compensate for the output level of the write signal by applying a compensation amount determined for each of weight regions assigned to a range of weight values that the synapse memory cell can take.

2. The synapse memory system according to claim 1, further comprising a lookup table (LUT) storing a compensation amount used to compensate for the output level of the write signal in updating the weight value stored in the synapse memory cell, wherein the output controller is configured to compensate for the output level of the write signal by referring to the LUT.

3. The synapse memory system according to claim 2, wherein the LUT comprises an LUT that is referred to in incrementing the weight value and an LUT that is referred to in decrementing the weight value.

4. The synapse memory system according to claim 2, wherein the LUT is updated according to the device characteristic of the NVRAM constituting the synapse memory cell, responsive to the system being used for the first time under predetermined conditions.

5. A synapse memory system comprising:
a plurality of synapse memory cells provided at cross points of a plurality of axon lines and a plurality of dendrite lines, each synapse memory cell comprising a non-volatile random access memory (NVRAM), each synapse memory cell being configured to store a weight value according to an output level of a write signal, the weight value to be stored in each synapse memory cell being one value of at least three different values;

a write portion configured to write the weight value to each synapse memory cell, the write portion comprising a write driver and an output controller, the write driver being configured to output the write signal to a subject synapse memory cell, the subject synapse memory cell being one of the synapse memory cells, the subject synapse memory cell being selected to store the weight value, the output controller being configured to control the output level of the write signal of the write driver; and read drivers configured to read the weight value stored in the synapse memory cells, wherein the write portion comprises a write driver, an output controller, and a lookup table (LUT), the LUT stores a value for controlling the write signal used to update the weight value stored in the synapse memory cell, the value being determined by a device characteristic of the NVRAM in the synapse memory cell, and the output controller is configured to control the output level of the write signal by referring to the LUT, wherein the value stored in the LUT is set for each of weight regions assigned to a range of weight values that the synapse memory cell can take, and wherein each of the weight regions is assigned to a plurality of unit weights each of which is defined based on resolution of the weight values that the synapse memory cell can take.

6. The synapse memory system according to claim 5, wherein the LUT comprises an LUT that is referred to in incrementing the weight value and an LUT that is referred to in decrementing the weight value.

7. The synapse memory system according to claim 5, wherein the LUT is stored in a rewritable non-volatile memory.

8. The synapse memory system according to claim 5, further comprising:
a device characteristic tester configured to examine the device characteristic of the NVRAM constituting the synapse memory cell;
a compensation amount calculator configured to calculate a compensation amount to compensate for the output level of the write signal output to the synapse memory cell, on the basis of the device characteristic of the NVRAM obtained by the device characteristic tester; and
an LUT writer configured to write, in the LUT, a value with which the output controller controls the output level of the write signal, on the basis of the compensation amount to compensate for the output level of the write signal calculated by the compensation amount calculator.

9. The synapse memory system according to claim 8, wherein the device characteristic tester, the compensation amount calculator, and the LUT writer are configured to operate in response to operation of the system under predetermined conditions and update the LUT.

10. A method for updating a memory cell, comprising:
determining a device characteristic of a non-volatile random access memory in a memory cell;
determining a weight compensation amount for the memory cell, based on the determined device characteristic; and
applying a write signal to the memory cell that includes the weight compensation amount,
wherein applying the write signal includes applying the determined weight compensation amount for each of weight regions assigned to a range of weight values that the memory cell can take, and wherein each of the weight regions is assigned to a plurality of unit weights, each of which is defined based on resolution of the weight values that the synapse memory cell can take.

11. The method according to claim 10, further comprising storing the determined weight compensation amount in a lookup table; and repeating the determination of the device characteristic, the determination of the weight compensation amount, and the storage of the weight compensation amount for a plurality of memory cells, wherein applying the write signal to the memory cell includes determining the weight compensation amount for the memory cell from the lookup table.

* * * * *